United States Patent
Ko et al.

(10) Patent No.: US 6,674,245 B2
(45) Date of Patent: Jan. 6, 2004

(54) ACTIVE MATRIX ORGANIC ELECTROLUMINESCENCE DISPLAY DEVICE AND METHOD OF FABRICATING THE SAME

(75) Inventors: Doo-Hyun Ko, Kyonggi-do (KR); Tae-Joon Ahn, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/327,891

(22) Filed: Dec. 26, 2002

(65) Prior Publication Data
US 2003/0122497 A1 Jul. 3, 2003

(30) Foreign Application Priority Data
Dec. 29, 2001 (KR) .................................. P2001-088544

(51) Int. Cl.[7] ................................................ G09G 3/10
(52) U.S. Cl. ............................ 315/169.3; 315/169.1; 257/298; 257/296; 257/308; 257/300; 345/48; 345/84
(58) Field of Search ......................... 315/169.3, 169.1, 315/169.2; 257/59, 72, 296, 298, 300, 306, 308, 408; 345/44–46, 48, 55, 76, 84, 92; 438/90, 99, 149, 217

(56) References Cited

U.S. PATENT DOCUMENTS

| | | | | |
|---|---|---|---|---|
| 5,923,062 A | * | 7/1999 | Ohno | 257/298 |
| 6,475,845 B2 | * | 11/2002 | Kimura | 438/200 |
| 6,518,630 B2 | * | 2/2003 | You et al. | 257/380 |
| 6,525,342 B2 | * | 2/2003 | Amemiya et al. | 257/59 |
| 6,569,717 B1 | * | 5/2003 | Murade | 438/149 |
| 6,573,952 B1 | * | 6/2003 | Yamazaki et al. | 349/13 |
| 6,583,576 B2 | * | 6/2003 | Koyama | 315/169.2 |

* cited by examiner

Primary Examiner—Haissa Philogene
(74) Attorney, Agent, or Firm—Morgan Lewis & Bockius LLP

(57) ABSTRACT

An active matrix organic electroluminescence display device and a method of fabricating the same are disclosed in the present invention. The device includes gate and data lines defining a pixel region on a substrate, a switching thin film transistor connected to the gate and data lines, a driving thin film transistor connected to the switching thin film transistor, a power line connected to the driving thin film transistor, a transparent first capacitor electrode connected to and overlapping the power line, a second capacitor electrode connected to the driving thin film transistor, and a pixel electrode formed at the pixel region and connected to the driving thin film transistor.

30 Claims, 7 Drawing Sheets

ACTIVE MATRIX ORGANIC ELECTROLUMINESCENCE DISPLAY DEVICE AND METHOD OF FABRICATING THE SAME

This application claims the benefit of the Korean Patent Application No. P2001-088544 filed on Dec. 29, 2001, which is hereby incorporated by reference.

BACKGROUND OF THE INVENTION

1. Field of the Invention

The present invention relates to a flat panel display device, and more particularly, to an active matrix organic electroluminescence display (ELD) device and a method of fabricating the same. Although the present invention is suitable for a wide scope of applications, it is particularly suitable for increasing a luminance and securing a storage capacitance at the same time.

2. Discussion of the Related Art

As information technologies develop rapidly, a necessity for flat panel displays, which have advantages of thinness, light weight, and low power consumption, has been increased. Accordingly, various flat panel display devices, such as a liquid crystal display (LCD) device, a plasma display panel (PDP), a field emission display device, and an electroluminescence display (ELD) device, have been researched and developed. The electro-luminescence display (ELD) device makes use of an electro-luminescence phenomenon, in which light is generated when an electric field of a certain intensity is applied to a fluorescent substance.

The electroluminescence display (ELD) devices can be classified into an inorganic electroluminescence display (ELD) device and an organic electroluminescence display (ELD) device depending upon a source material for exciting carriers. The organic electroluminescence display (ELD) device has drawn attention as an efficient display device for natural colors because it can display all colors from the entire visible light range, and has a high brightness and a low driving voltage. In addition, because the organic electroluminescence display (ELD) device is self-luminescent, it has a high contrast ratio and is suitable for an ultra-thin type display device. Moreover, due to its simple manufacturing process, a level of environmental contamination may become relatively low. Besides, the organic electroluminescence display (ELD) device has a response time of only a few microseconds ($\mu s$), so that it is suitable for displaying moving images. The organic electroluminescence display (ELD) device has no limit in a viewing angle and is stable at low temperature conditions. Because it is driven with a relatively low voltage in the range of about 5V and 15V, manufacturing and design of a driving circuit are easy.

A structure of the organic electroluminescence display (ELD) device is similar to that of the inorganic electroluminescence display (ELD) device, except for that a light-emitting principle is different from that of the inorganic electroluminescence display (ELD) device. More specifically, the organic electroluminescence display (ELD) device emits light on a recombination of an electron and a hole, and thus being referred to as an organic light emitting diode (OLED). Recently, an active matrix type, in which a plurality of pixels are arranged in a matrix form, and a thin film transistor is connected thereto, has been widely applied to the flat panel display devices. The active matrix type is also applied to the organic electro-luminescence display (ELD) device, which is referred to as an active matrix organic electroluminescence display (ELD) device.

FIG. 1 is a circuit diagram illustrating a pixel of a related art active matrix organic electroluminescence display device. As shown in FIG. 1, a pixel of the active matrix organic electro-luminescent display device has a switching thin film transistor 4, a driving thin film transistor 5, a storage capacitor 6, and a light emitting diode (LED) 7. The switching thin film transistor 4 and the driving thin film transistor 5 are formed of p-type polycrystalline silicon thin film transistors. A gate electrode of the switching thin film transistor 4 is connected to the gate line 1, and a source electrode is connected to the data line 2. A drain electrode of the switching thin film transistor 4 is connected to a gate electrode of the driving thin film transistor 5. A drain electrode of the driving thin film transistor 5 is connected to an anode electrode of the light emitting diode (LED) 7. A source electrode of the driving thin film transistor 5 is connected to a power line 3, and a cathode electrode of the light emitting diode (LED) 7 is grounded. A storage capacitor 6 is connected to the gate electrode and the source electrode of the driving thin film transistor 5.

When a signal is applied to the gate line 1, the switching thin film transistor 4 is turned on, and an image signal from the data line 2 is stored into the storage capacitor 6 through the switching thin film transistor 4. When the image signal is applied to the gate electrode of the driving thin film transistor 5, the driving thin film transistor 5 is turned on, thereby allowing the light emitting diode (LED) 7 to emit light. A luminance of the light emitting diode (LED) 7 is controlled by varying a current of the light emitting diode (LED) 7. The storage capacitor 6 keeps a gate voltage of the driving thin film transistor 5 constant even when the switching thin film transistor 4 is turned off. More specifically, since the driving thin film transistor 5 can be driven by a stored voltage in the storage capacitor 6, even when the switch thin film transistor is turned off, the electric current may continue to flow into the light emitting diode (LED) 7, therby allowing the light emitting diode (LED) to emit light until the next image signal comes in.

FIG. 2 is a plane view of the related art active matrix organic electroluminescence display (ELD) device. As shown in FIG. 2, a gate line 21 and a data line 22 cross each other and define a pixel region "P". A switching thin film transistor $T_S$ is formed at each crossing point of the gate and data lines 21 and 22 and connected to the gate and data line 21 and 22. A driving thin film transistor $T_D$, which is connected to the switching thin film transistor $T_S$, is formed in the pixel region "P". A gate electrode 41 of a driving thin film transistor $T_D$ is connected to a drain electrode 31 of a switching thin film transistor $T_S$. A source electrode 42 of the driving thin film transistor $T_D$ is connected to a power line 51, which is parallel to the data line 22. A drain electrode 43 of the driving thin film transistor $T_D$ is formed in the pixel region "P" and connected to a pixel electrode 61, which is formed of a transparent conductive material. A first capacitor electrode 52, which is connected to the power line 51, is formed in the pixel region "P". A second capacitor electrode 71 and 72 is formed of polycrystalline silicon and connected to the gate electrode 41 of the driving thin film transistor $T_D$. The second capacitor electrode 71 and 72 overlaps the power line 51 and the first capacitor electrode 52 to form a storage capacitor.

However, since the power line 51 and the first capacitor electrode 52 are formed of an opaque metal material, in the above-described active matrix organic electroluminescence display device, an aperture ratio is decreased. Accordingly, an area of the storage capacitor in the pixel region "P" must be reduced in order to increase the aperture ratio. However, when the area of the storage capacitor is reduced, a storage capacitance of the storage capacitor is decreased, thereby increasing a kick-back voltage. In addition, a leakage of a signal cannot be prevented. Furthermore, in the related art active matrix organic electro-luminescence display (ELD) device, resistances of the power line are electrically connected in series, thereby resulting in a relatively high resistance. Accordingly, an image of low picture quality is displayed due to the heat generated by the high resistance of the power line. This problem becomes more serious as the active matrix organic electroluminescence display (ELD) device becomes larger in size.

SUMMARY OF THE INVENTION

Accordingly, the present invention is directed to an active matrix organic electroluminescence display (ELD) device and a method of fabricating the same that substantially obviates one or more of problems due to limitations and disadvantages of the related art.

Another object of the present invention is to provide an active matrix organic electroluminescence display (ELD) device and a method of fabricating the same, in which a capacitor electrode is formed of a transparent conductive material to increase a luminance and secure a storage capacitance at the same time.

Another object of the present invention is to provide an active matrix organic electroluminescence display (ELD) device and a method of fabricating the same, in which power lines are connected to each other in parallel to reduce a total electrical resistance of the power line, thereby improving a picture quality of displayed images by preventing a heat generation caused by high resistance.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an active matrix organic electroluminescence display (ELD) device includes gate and data lines defining a pixel region on a substrate, a switching thin film transistor connected to the gate and data lines, a driving thin film transistor connected to the switching thin film transistor, a power line connected to the driving thin film transistor, a transparent first capacitor electrode connected to and overlapping the power line, a second capacitor electrode connected to the driving thin film transistor, and a pixel electrode formed at the pixel region and connected to the first driving thin film transistor.

Herein, the power line is formed of the same material as the first capacitor electrode. The first capacitor electrode is formed of one of indium tin oxide (ITO) and indium zinc oxide (IZO)

The active matrix organic electroluminescence display device further includes contact holes at the overlapped portion of the power line and the first capacitor electrode.

The power line may also be formed of an opaque metal material, and the first capacitor electrode may be formed of one of indium tin oxide (ITO) and indium zinc oxide (IZO). The second capacitor electrode is formed of doped polycrystalline silicon.

In another aspect of the present invention, an active matrix organic electroluminescence display (ELD) device includes gate and data lines defining a pixel region on a substrate, a switching thin film transistor connected to the gate and data lines, a driving thin film transistor connected to the switching thin film transistor, a power line connected to the driving thin film transistor and having first, second, and third portions, the first and second portions being parallel to the data line, the third portion connecting the first and second portions, the first portion being connected to the second portion of the power line of an adjacent pixel region, a first capacitor electrode connected to the first driving thin film transistor and overlapping the first portion of the power line, and a pixel electrode formed at the pixel region and connected to the first driving thin film transistor.

Herein, the second and third portions of the power line overlap edge portions of the pixel electrode. The power line is formed of a transparent conductive material. The power line may also be formed of one of indium tin oxide (ITO) and indium zinc oxide (IZO).

The active matrix organic electroluminescence display (ELD) device further includes a second capacitor electrode extended from the first portion of the power line to the pixel region, and a third capacitor electrode extended from the first capacitor electrode and overlapping the second capacitor electrode.

The second capacitor electrode may be formed of one of indium tin oxide (ITO) and indium zinc oxide (IZO), and the third capacitor electrode may be formed of doped polycrystalline silicon. The first capacitor electrode may also be formed of doped polycrystalline silicon.

In another aspect of the present invention, an active matrix organic electroluminescence display device includes gate and data lines defining a pixel region on a substrate, a first switching thin film transistor connected to the gate and data lines, a first driving thin film transistor connected to the first switching thin film transistor, a second switching thin film transistor connected to the first switching thin film transistor, a second driving thin film transistor connected to the second switching thin film transistor and the first driving thin film transistor, a power line connected to the first driving thin film transistor, a first capacitor electrode formed of a transparent conductive material on the pixel region and connected to the power line, a second capacitor electrode connected to the first driving thin film transistor and overlapping the first capacitor electrode, and a pixel electrode formed at the pixel region and connected to the first driving thin film transistor.

In another aspect of the present invention, an active matrix organic electroluminescence display device includes gate and data lines defining a pixel region on a substrate, a first switching thin film transistor connected to the gate and data lines, a first driving thin film transistor connected to the first switching thin film transistor, a second switching thin film transistor connected to the first switching thin film transistor, a second driving thin film transistor connected to the second switching thin film transistor and the first driving thin film transistor, a power line connected to the first driving thin film transistor and having first, second, and third portions, the first and second portions being parallel to the data line, the third portion connecting the first and second portions, the first portion being connected to the second portion of the power line of an adjacent pixel region, a first capacitor electrode connected to the first driving thin film transistor and overlapping the first portion of the power line, and a pixel electrode formed in the pixel region and connected to the first driving thin film transistor.

In another aspect of the present invention, a method of forming an active matrix organic electroluminescence display device includes forming gate and data lines defining a pixel region on a substrate, forming a switching thin film transistor connected to the gate and data lines, forming a driving thin film transistor connected to the switching thin film transistor, forming a power line connected to the driving thin film transistor, forming a transparent first capacitor electrode connected to and overlapping the power line, forming a second capacitor electrode connected to the driving thin film transistor, and forming a pixel electrode formed at the pixel region and connected to the driving thin film transistor.

In another aspect of the present invention, a method of forming an active matrix organic electroluminescence display device includes forming gate and data lines defining a pixel region on a substrate, forming a switching thin film transistor connected to the gate and data lines, forming a driving thin film transistor connected to the switching thin film transistor, forming a power line connected to the driving thin film transistor and having first, second, and third portions, the first and second portions being parallel to the data line, the third portion connecting the first and second portions, the first portion being connected to the second portion of the power line of an adjacent pixel region, forming a first capacitor electrode connected to the driving thin film transistor and overlapping the first portion of the power line, and forming a pixel electrode formed at the pixel region and connected to the driving thin film transistor.

In another aspect of the present invention, a method of forming an active matrix organic electroluminescence display device includes forming gate and data lines defining a pixel region on a substrate, forming a first switching thin film transistor connected to the gate and data lines, forming a first driving thin film transistor connected to the first switching thin film transistor, forming a second switching thin film transistor connected to the first switching thin film transistor, forming a second driving thin film transistor connected to the second switching thin film transistor and the first driving thin film transistor, forming a power line connected to the first driving thin film transistor, forming a first capacitor electrode formed of a transparent conductive material on the pixel region and connected to the power line, forming a second capacitor electrode connected to the first driving thin film transistor and overlapping the first capacitor electrode, and forming a pixel electrode formed at the pixel region and connected to the first driving thin film transistor.

In a further aspect of the present invention, a method of forming an active matrix organic electroluminescence display device includes forming gate and data lines defining a pixel region on a substrate, forming a first switching thin film transistor connected to the gate and data lines, forming a first driving thin film transistor connected to the first switching thin film transistor, forming a second switching thin film transistor connected to the first switching thin film transistor, forming a second driving thin film transistor connected to the second switching thin film transistor and the first driving thin film transistor, forming a power line connected to the first driving thin film transistor and having first, second, and third portions, the first and second portions being parallel to the data line, the third portion connecting the first and second portions, the first portion being connected to the second portion of the power line of an adjacent pixel region, forming a first capacitor electrode connected to the first driving thin film transistor and overlapping the first portion of the power line, and forming a pixel electrode formed in the pixel region and connected to the first driving thin film transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1:
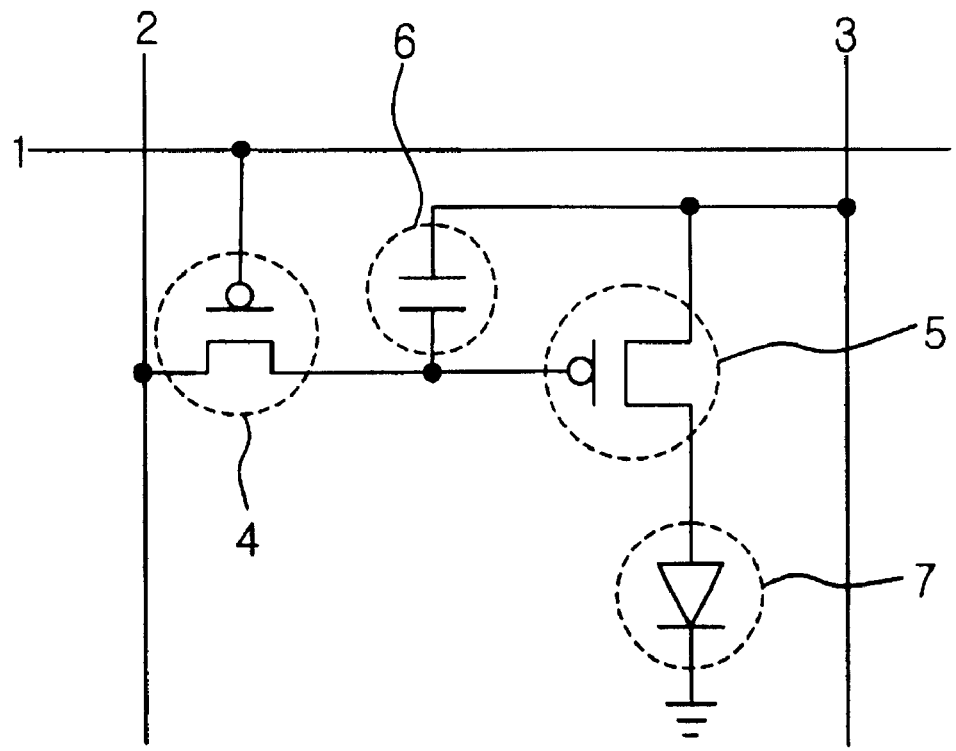
FIG. 1 is a circuit diagram illustrating a pixel of a related art active matrix organic electroluminescence display (ELD) device.
Figure 2:
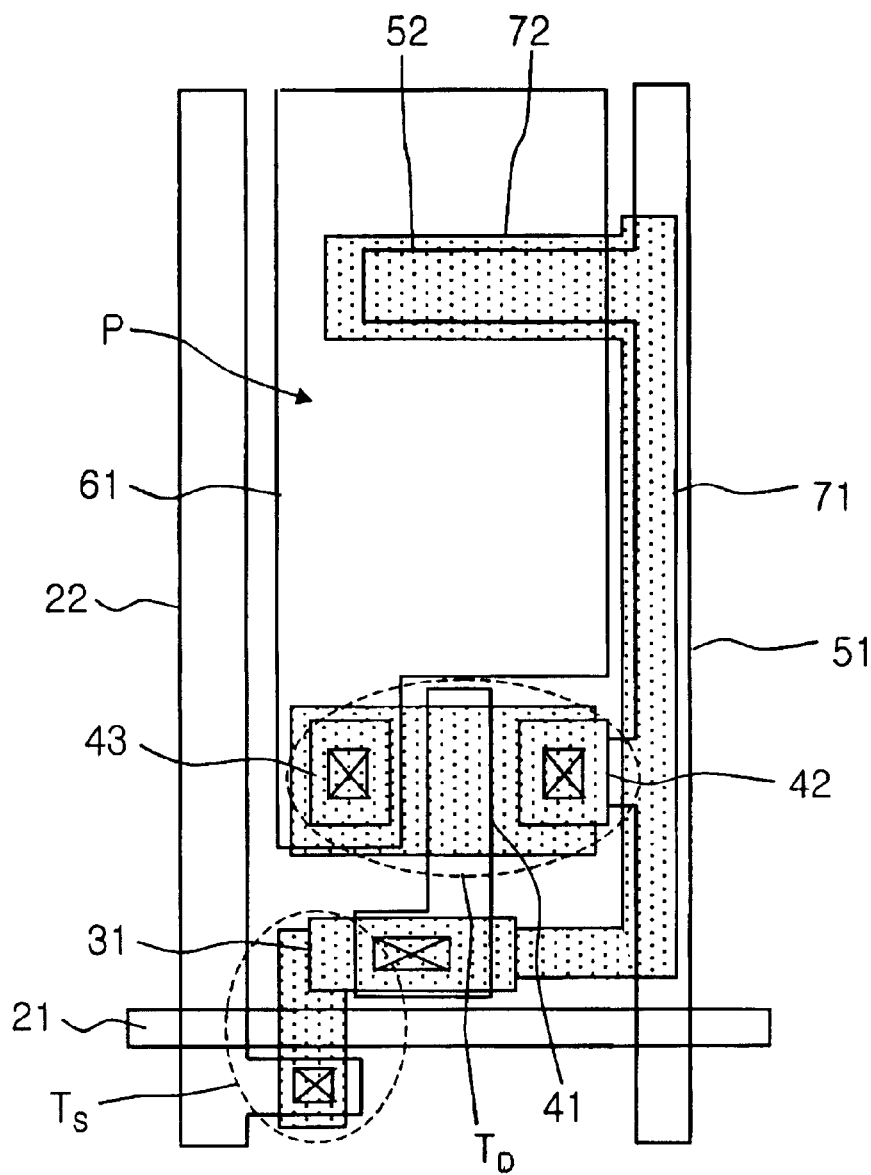
FIG. 2 is a plane view of the related art active matrix organic electroluminescence display (ELD) device.
Figure 3:
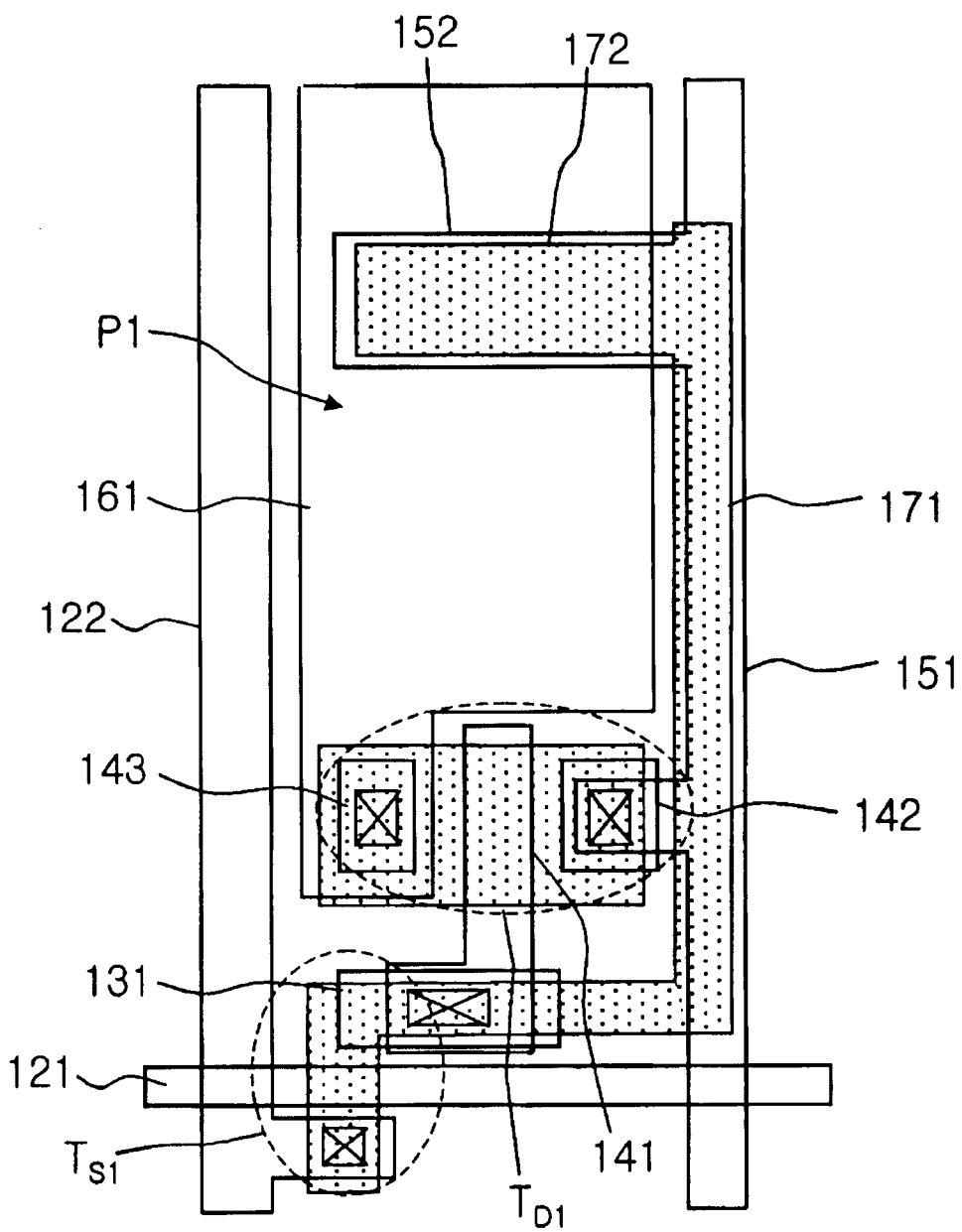
FIG. 3 is a plane view of an active matrix organic electroluminescence display (ELD) device according to a first embodiment of the present invention.

FIG. 3 is a plane view of an active matrix organic electroluminescence display (ELD) device according to a first embodiment of the present invention. As shown in FIG. 3, a gate line 121 and a data line 122 cross each other and define a pixel region "P1". A switching thin film transistor $T_{S1}$ is formed at each crossing point of the gate and data lines 121 and 122 and connected to the gate and data lines 121 and 122. A portion of the gate line 121 becomes a gate electrode of the switching thin film transistor $T_{S1}$. A driving thin film transistor $T_{D1}$ is formed in the pixel region "P1" and connected to the switching thin film transistor $T_{S1}$. A gate electrode 141 of the driving thin film transistor $T_{D1}$ is connected to a drain electrode 131 of the switching thin film transistor $T_{S1}$, and a source electrode 142 of the driving thin film transistor $T_{D1}$ is connected to a power line 151 that is parallel with the data line 122. A drain electrode 143 of the driving thin film transistor $T_{D1}$ is formed in the pixel region "P1" and connected to a pixel electrode 161, which is formed of a transparent conductive material. The pixel electrode 161 may be formed of one of indium tin oxide (ITO) and indium zinc oxide (IZO). A first capacitor electrode 152 is formed in the pixel region "P1" and connected to the power line 151. The first capacitor electrode 152 and the power line 151 are formed of a transparent conductive material, such as indium tin oxide (ITO) and indium zinc oxide (IZO). Accordingly, a storage capacitance may be increased by increasing an area of the first capacitor electrode 152. A second capacitor electrode 171 and 172, which is connected to the gate electrode 141 of the driving thin film transistor $T_{D1}$, forms a storage capacitor by overlapping the power line 151 and the first capacitor electrode 152. The second capacitor electrode 171 and 172 may be formed of impurities doped polycrystalline silicon.

Accordingly, since the power line 151 and the first capacitor electrode 152 are formed of a transparent conductive material according to the first embodiment of the present invention, an aperture ratio may be improved. A storage capacitance of the storage capacitor may also be increased.

However, indium tin oxide (ITO) and indium zinc oxide (IZO) that are used for the power line 151 and the first capacitor electrode 152, are disadvantageous in that they have a higher electrical resistance than other metal materials. Accordingly, a picture quality of displayed images may be deteriorated due to an increased resistance of a wiring. Therefore, an active matrix organic electroluminescence display (ELD) device according to a second embodiment of the present invention is provided to overcome this problem.

Figure 4:
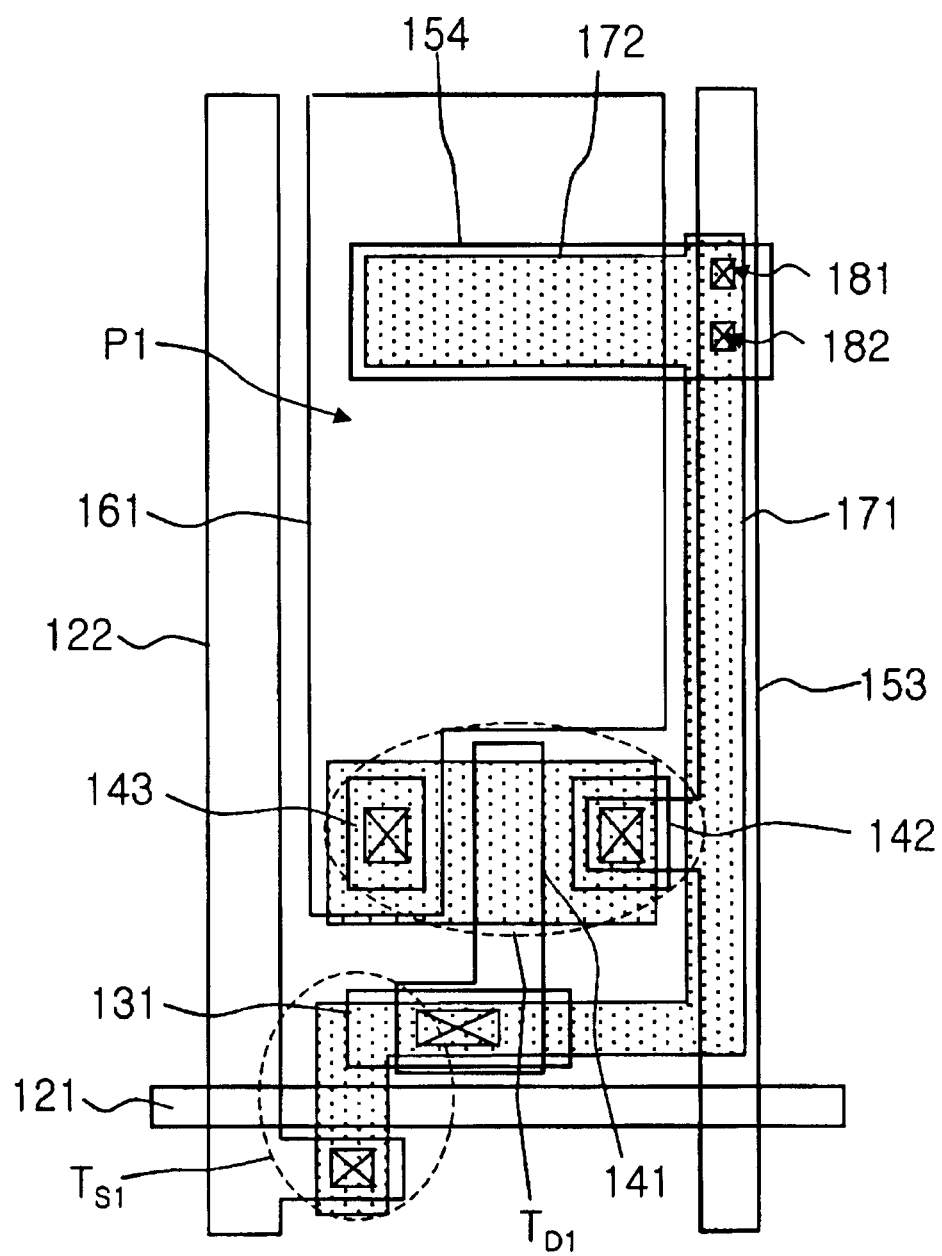
FIG. 4 is a plane view of an active matrix organic electroluminescence display (ELD) device according to a second embodiment of the present invention.

FIG. 4 is a plane view of an active matrix organic electroluminescence display (ELD) device according to a second embodiment of the present invention. Since the active matrix organic electroluminescence display (ELD) device according to the second embodiment of the present invention has the same structure as that of the first embodiment except for the power line and the first capacitor electrode, explanations of the same parts in the first embodiment will be omitted for simplicity.

As shown in FIG. 4, a power line 153 is vertically formed, and a first capacitor electrode 154 is formed in the pixel region "P1". The power line 153 is formed of an opaque metal material, and the first capacitor electrode 154 is formed of a transparent conductive material, such as indium tin oxide (ITO) and indium zinc oxide (IZO). First and second contact holes 181 and 182 are formed at a portion where the first capacitor electrode 154 and the power line 153 overlap one another. The first capacitor electrode 154 is connected to the power line 153 through the first and second contact holes 181 and 182.

Because the power line 153 is formed of an opaque metal material, and the first capacitor electrode 154 is formed of transparent conductive material, in the active matrix organic electroluminescence display device according to the second embodiment, an electrical resistance of the power line is decreased and, an aperture ratio is increased at the same time. Besides, a storage capacitance of the storage capacitor is secured because the first capacitor electrode, which is formed in the pixel electrode, is formed of a transparent conductive material.

Meanwhile, according to the first and second embodiments, since the electrical resistances of the power lines are connected in series, the electrical resistance is relatively high. An active matrix organic electroluminescence display (ELD) device according to a third embodiment of the present invention, shown in FIG. 5, is provided to reduce the electrical resistances of the power line.

Figure 5:
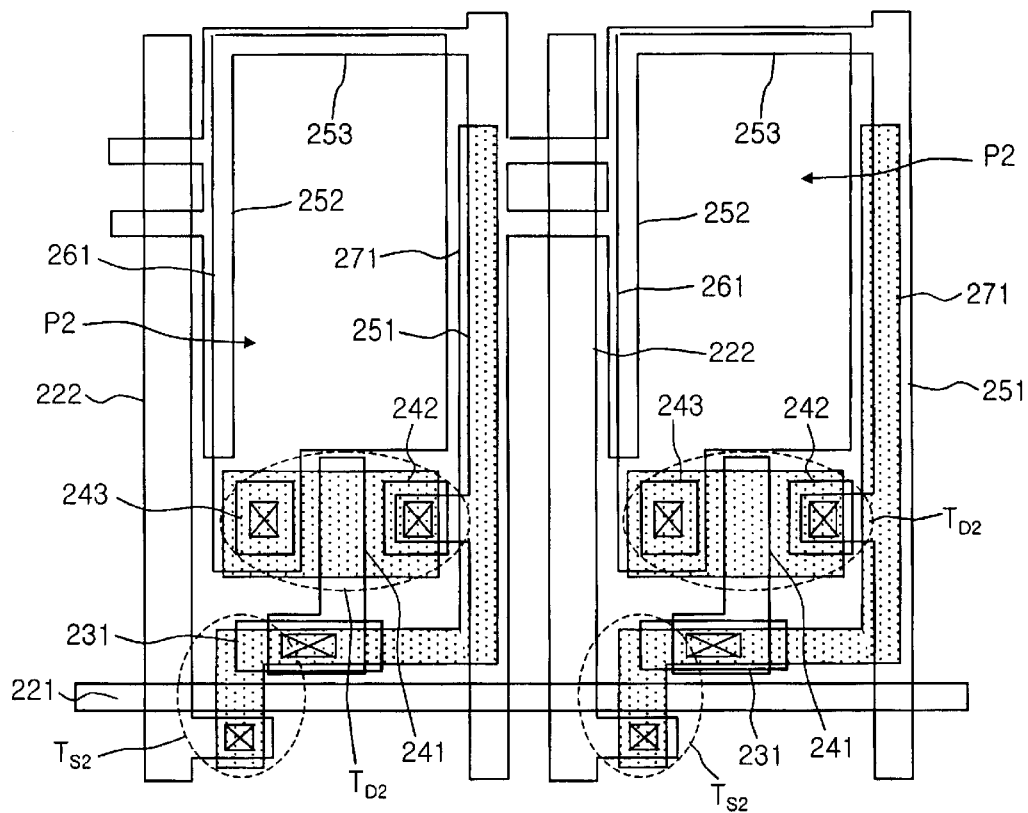
FIG. 5 is a plane view of an active matrix organic electroluminescence display (ELD) device according to a third embodiment of the present invention.

FIG. 5 is a plane view of an active matrix organic electroluminescence display (ELD) device according to a third embodiment of the present invention. As shown in FIG. 5, a gate line 221 and a data line 222 define a pixel region "P2" by crossing each other. A switching thin film transistor $T_{S2}$ is formed at each crossing point of the gate and data lines 221 and 222 and connected to the gate and data lines 221 and 222. A portion of the gate line 221 becomes a gate electrode of the switch thin film transistor $T_{S2}$. A driving thin film transistor $T_{D2}$ is formed in the pixel region "P2" and connected to the switch thin film transistor $T_{S2}$. A gate electrode 241 of the driving thin film transistor $T_{D2}$ is connected to a drain electrode 231 of the switching thin film transistor $T_{S2}$. A source electrode 242 of the driving thin film transistor $T_{D2}$ is connected to a power line 251, 252, and 253. A drain electrode 243 of the driving thin film transistor $T_{D2}$ is formed in the pixel region "P2" and connected to a pixel electrode 261 that is formed of a transparent conductive material. The pixel electrode 261 may be formed of one of indium tin oxide (ITO) and indium zinc oxide (IZO).

The power line has a first portion 251, a second portion 252, and a third portion 253. The first and second portions 251 and 252 of the power line are formed in the vertical direction, and the third portion 253 of the power line connects the first portion 251 and the second portion 252 to one another. The second and third portions 252 and 253 partially overlap edge portions of the pixel electrode 261. The first portion 251 of the power line is connected to a second portion 252 of an adjacent pixel region "P2". The power line 251, 252, and 253 may be formed of an opaque metal material.

A first capacitor electrode 271, which is connected to the gate electrode 241 of the driving thin film transistor, overlaps the first portion 251 of the power line and forms a storage capacitor together with the first portion 251 of the power line. The first capacitor electrode 271 may be formed of doped polycrystalline silicon. Accordingly, a total electrical resistance of the power line is reduced by connecting each power line in parallel according to the third embodiment of the present invention.

As a result, a picture quality of displayed images may be improved by preventing a heat generation, which is caused by an increase in electrical resistance of the power line. Meanwhile, since the electrical resistance is reduced when the power lines are connected in parallel, as in the third embodiment of the present invention, the power line may be formed of a transparent conductive material.

Figure 6:
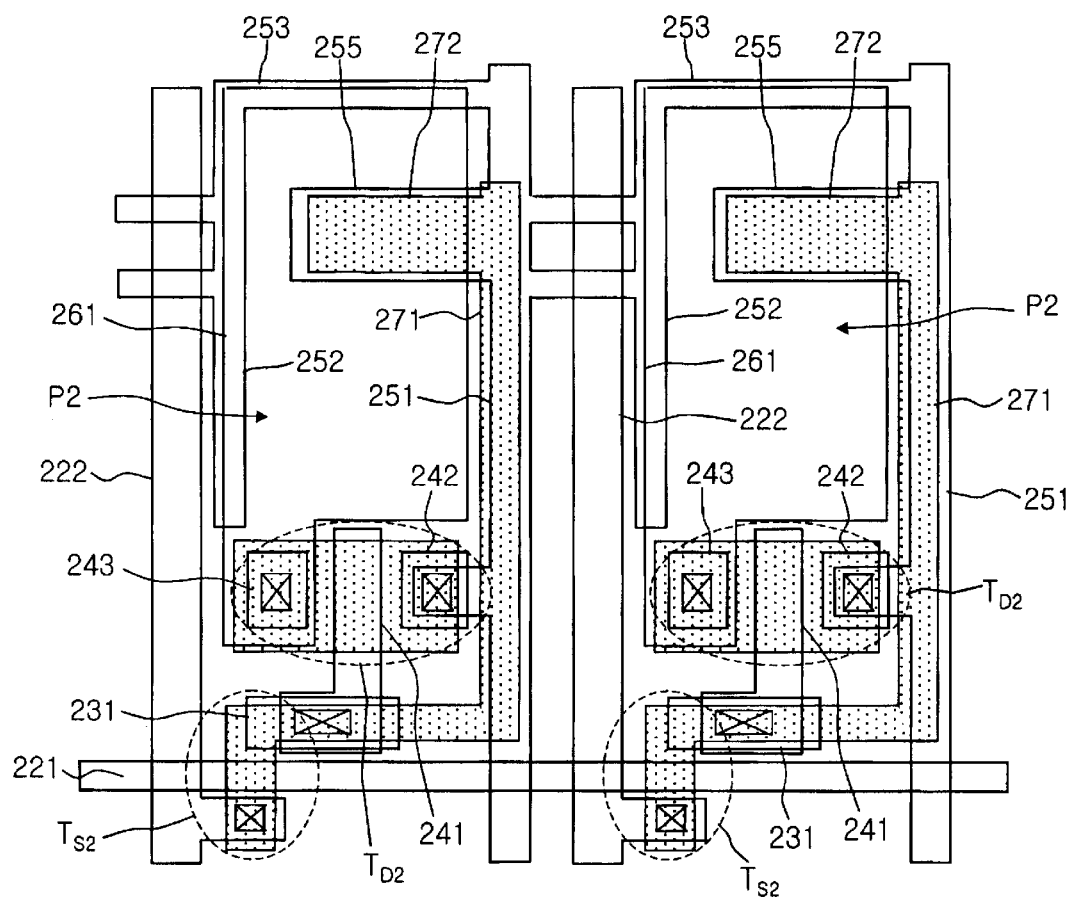
FIG. 6 is a plane view of an active matrix organic electroluminescence display (ELD) device according to a fourth embodiment of the present invention.

FIG. 6 is a plane view of an active matrix organic electroluminescence display (ELD) device according to a fourth embodiment of the present invention. As shown in FIG. 6, a power line has first, second, and third portions 251, 252, and 253. The first and second portions 251 and 252 are formed in the vertical direction, and the third portion 253 connects the first and second portions 251 and 252 to one another. The first portion 251 of the power line is connected to a second portion 252 of the adjacent pixel region "P2". A second capacitor electrode 255 is formed in the pixel region "P2" and connected to the first portion 251 of the power line. The second capacitor electrode 255 overlaps a third capacitor electrode 272, which is extended from a first capacitor electrode 271.

The power line 251, 252, and 253 and the second capacitor electrode 255 are formed of a transparent conductive material, such as indium tin oxide (ITO) or indium zinc oxide (IZO). More specifically, since the power line is connected in parallel and reduces the electrical resistance, the power line 251, 252, and 253 and the first capacitor electrode 255 may be formed of a transparent conductive material. The aperture ratio may be increased accordingly, and a storage capacitance of the storage capacitor may be increased by forming an additional capacitor electrode in the pixel region "P2" with a transparent conductive material.

Although only the active matrix organic electroluminescence display (ELD) device having two thin film transistors in a pixel has been described in the previous embodiments of the present invention, the same embodiment may be applied to the active matrix organic electroluminescence display (ELD) device having four thin film transistors in a pixel, whereby a uniformity of displayed images is improved.

Figure 7:
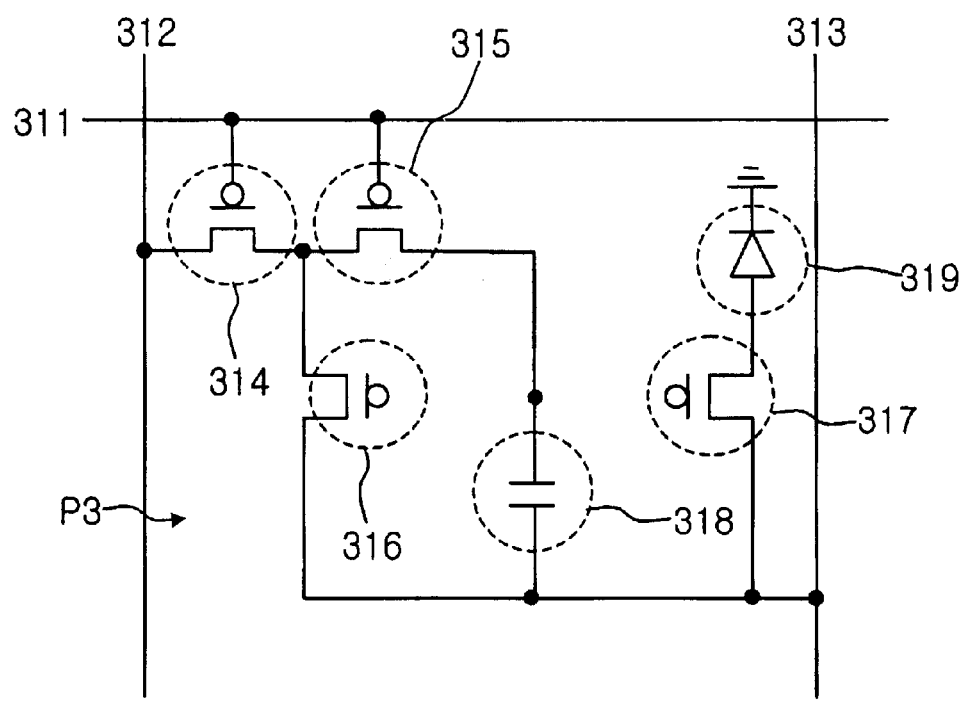
FIG. 7 is a circuit diagram illustrating a pixel of an active matrix organic electroluminescence display device according to a fifth embodiment of the present invention.

FIG. 7 is a circuit diagram illustrating a pixel of an active matrix organic electroluminescence display (ELD) device according to a fifth embodiment of the present invention. As shown in FIG. 7, a gate line 311 and a data line 312 define a pixel region "P3" by crossing each other. A pixel includes first and second switching thin film transistors 314 and 315, first and second driving thin film transistors 316 and 317, a storage capacitor 318, and a light emitting diode (LED) 319. Gate electrodes of the first and second switching thin film transistors 314 and 315 are connected to the gate line 311.

A source electrode of the first switching thin film transistor 314 is connected to the data line 312. A drain electrode of the first switching thin film transistor 314 is connected to a source electrode of the second switching thin film transistor 315. A source electrode of the first driving thin film transistor 316 is connected to the drain electrode of the first switching thin film transistor 314 and the source electrode of the second switching thin film transistor 315. A gate electrode of the first driving thin film transistor 316 is connected to the drain electrode of the second switching thin film transistor 315 and a gate electrode of the second driving thin film transistor 317. A source electrode of the second driving thin film transistor 317 is connected to the drain electrode of the first driving thin film transistor 316 and a power line 313. A drain electrode of the second driving thin film transistor 317 is connected to an anode electrode of the light emitting diode (LED) 319. A cathode electrode of the light emitting diode (LED) 319 is grounded. The storage capacitor 318 is connected to the first and second driving thin film transistors 316 and 317. An electrode of the storage capacitor 318 is connected to the drain electrode of the first driving thin film transistor 316 and the source electrode of the second driving thin film transistor 317. And, another electrode is connected to gate electrodes of the first and second driving thin film transistors 316 and 317.

Accordingly, the first and second switching thin film transistors 314 and 315 are turned on by a signal of the gate line 311. Then, a signal of the data line 312 is transmitted to the first and second driving thin film transistors 316 and 317. The transmitted signal of the data line 312 turns the second driving thin film transistor 317 on, and thereafter an image signal "Vdd" of the power line 313 is transmitted to the light emitting diode (LED) 319, which then emits light.

As stated above, the aperture ratio and the storage capacitance of the active matrix organic electroluminescence display (ELD) device are increased by forming a power line and an electrode of the storage capacitor with transparent conductive materials according to the present invention. In addition, the total electrical resistance of the power line is reduced by connecting the power in parallel, thereby improving a picture quality of displayed images by preventing heat generated from high resistance.

It will be apparent to those skilled in the art that various modifications and variations can be made in the active matrix organic electroluminescence display device and the method of fabricating the same of the present invention without departing from the spirit or scope of the inventions. Thus, it is intended that the present invention covers the modifications and variations of this invention provided they come within the scope of the appended claims and their equivalents.

What is claimed is:

1. An active matrix organic electroluminescence display device, comprising:
    gate and data lines defining a pixel region on a substrate;
    a switching thin film transistor connected to the gate and data lines;
    a driving thin film transistor connected to the switching thin film transistor;
    a power line connected to the driving thin film transistor;
    a transparent first capacitor electrode connected to and overlapping the power line;
    a second capacitor electrode connected to the driving thin film transistor; and
    a pixel electrode formed at the pixel region and connected to the driving thin film transistor.

2. The device according to claim 1, wherein the power line is formed of the same material as the first capacitor electrode.

3. The device according to claim 1, wherein the first capacitor electrode is formed of one of indium tin oxide (ITO) and indium zinc oxide (IZO).

4. The device according to claim 1, further comprising contact holes at the overlapped portion of the power line and the first capacitor electrode.

5. The device according to claim 4, wherein the power line is formed of an opaque metal material, and the first capacitor electrode is formed of one of indium tin oxide (ITO) and indium zinc oxide (IZO).

6. The device according to claim 1, wherein the second capacitor electrode is formed of doped polycrystalline silicon.

7. An active matrix organic electroluminescence display device, comprising:
    gate and data lines defining a pixel region on a substrate;
    a switching thin film transistor connected to the gate and data lines;
    a driving thin film transistor connected to the switching thin film transistor;
    a power line connected to the driving thin film transistor and having first, second, and third portions, the first and second portions being parallel to the data line, the third portion connecting the first and second portions, the first portion being connected to the second portion of the power line of an adjacent pixel region;
    a first capacitor electrode connected to the driving thin film transistor and overlapping the first portion of the power line; and
    a pixel electrode formed at the pixel region and connected to the driving thin film transistor.

8. The device according to claim 7, wherein the second and third portions of the power line overlap edge portions of the pixel electrode.

9. The device according to claim 8, wherein the power line is formed of a transparent conductive material.

10. The device according to claim 9, wherein the power line is formed of one of indium tin oxide (ITO) and indium zinc oxide (IZO).

11. The device according to claim 7, further comprising a second capacitor electrode extended from the first portion of the power line to the pixel region, and a third capacitor electrode extended from the first capacitor electrode and overlapping the second capacitor electrode.

12. The device according to claim 11, wherein the second capacitor electrode is formed of one of indium tin oxide (ITO) and indium zinc oxide (IZO), and the third capacitor electrode is formed of doped polycrystalline silicon.

13. The device according to claim 7, wherein the first capacitor electrode is formed of doped polycrystalline silicon.

14. An active matrix organic electroluminescence display device, comprising:
- gate and data lines defining a pixel region on a substrate;
- a first switching thin film transistor connected to the gate and data lines;
- a first driving thin film transistor connected to the first switching thin film transistor;
- a second switching thin film transistor connected to the first switching thin film transistor;
- a second driving thin film transistor connected to the second switching thin film transistor and the first driving thin film transistor;
- a power line connected to the first driving thin film transistor;
- a first capacitor electrode formed of a transparent conductive material on the pixel region and connected to the power line;
- a second capacitor electrode connected to the first driving thin film transistor and overlapping the first capacitor electrode; and
- a pixel electrode formed at the pixel region and connected to the first driving thin film transistor.

15. The device according to claim 14, wherein the power line is formed of the same material as the first capacitor electrode.

16. The device according to claim 15, wherein the first capacitor electrode is formed of one of indium tin oxide (ITO) and indium zinc oxide (IZO).

17. The device according to claim 14, wherein the power line and the first capacitor electrode overlap each other, and the overlapped portion has contact holes.

18. The device according to claim 17, wherein the power line is formed of an opaque metal material, and the first capacitor electrode is formed of one of indium tin oxide (ITO) and indium zinc oxide (IZO).

19. The device according to claim 14, wherein the second capacitor electrode is formed of doped polycrystalline silicon.

20. An active matrix organic electroluminescence display device, comprising:
- gate and data lines defining a pixel region on a substrate;
- a first switching thin film transistor connected to the gate and data lines;
- a first driving thin film transistor connected to the first switching thin film transistor;
- a second switching thin film transistor connected to the first switching thin film transistor;
- a second driving thin film transistor connected to the second switching thin film transistor and the first driving thin film transistor;
- a power line connected to the first driving thin film transistor and having first, second, and third portions, the first and second portions being parallel to the data line, the third portion connecting the first and second portions, the first portion being connected to the second portion of the power line of an adjacent pixel region;
- a first capacitor electrode connected to the first driving thin film transistor and overlapping the first portion of the power line; and
- a pixel electrode formed in the pixel region and connected to the first driving thin film transistor.

21. The device according to claim 20, wherein the second and third portions of the power line overlap edge portions of the pixel electrode.

22. The device according to claim 21, wherein the power line is formed of a transparent conductive material.

23. The device according to claim 22, wherein the power line is formed of one of indium tin oxide (ITO) and indium zinc oxide (IZO).

24. The device according to claim 20, further comprising a second capacitor electrode extended from the first portion of the power line to the pixel region, and a third capacitor electrode extended from the first capacitor electrode and overlapping the second capacitor electrode.

25. The device according to claim 24, wherein the second capacitor electrode is formed of one of indium tin oxide (ITO) and indium zinc oxide (IZO), and the third capacitor electrode is formed of doped polycrystalline silicon.

26. The device according to claim 20, wherein the first capacitor electrode is formed of doped polycrystalline silicon.

27. The method of forming an active matrix organic electroluminescence display device, comprising:
- forming gate and data lines defining a pixel region on a substrate;
- forming a switching thin film transistor connected to the gate and data lines;
- forming a driving thin film transistor connected to the switching thin film transistor;
- forming a power line connected to the driving thin film transistor;
- forming a transparent first capacitor electrode connected to and overlapping the power line;
- forming a second capacitor electrode connected to the driving thin film transistor; and
- forming a pixel electrode formed at the pixel region and connected to the driving thin film transistor.

28. A method of forming an active matrix organic electroluminescence display device, comprising:
- forming gate and data lines defining a pixel region on a substrate;
- forming a switching thin film transistor connected to the gate and data lines;
- forming a driving thin film transistor connected to the switching thin film transistor;
- forming a power line connected to the driving thin film transistor and having first, second, and third portions, the first and second portions being parallel to the data line, the third portion connecting the first and second portions, the first portion being connected to the second portion of the power line of an adjacent pixel region;
- forming a first capacitor electrode connected to the driving thin film transistor and overlapping the first portion of the power line; and
- forming a pixel electrode formed at the pixel region and connected to the driving thin film transistor.

29. A method of forming an active matrix organic electroluminescence display device, comprising:
- forming gate and data lines defining a pixel region on a substrate;
- forming a first switching thin film transistor connected to the gate and data lines;
- forming a first driving thin film transistor connected to the first switching thin film transistor;
- forming a second switching thin film transistor connected to the first switching thin film transistor;

forming a second driving thin film transistor connected to the second switching thin film transistor and the first driving thin film transistor;

forming a power line connected to the first driving thin film transistor;

forming a first capacitor electrode formed of a transparent conductive material on the pixel region and connected to the power line;

forming a second capacitor electrode connected to the first driving thin film transistor and overlapping the first capacitor electrode; and forming a pixel electrode formed at the pixel region and connected to the first driving thin film transistor.

30. A method of forming an active matrix organic electroluminescence display device, comprising:

forming gate and data lines defining a pixel region on a substrate;

forming a first switching thin film transistor connected to the gate and data lines;

forming a first driving thin film transistor connected to the first switching thin film transistor;

forming a second switching thin film transistor connected to the first switching thin film transistor;

forming a second driving thin film transistor connected to the second switching thin film transistor and the first driving thin film transistor;

forming a power line connected to the first driving thin film transistor and having first, second, and third portions, the first and second portions being parallel to the data line, the third portion connecting the first and second portions, the first portion being connected to the second portion of the power line of an adjacent pixel region;

forming a first capacitor electrode connected to the first driving thin film transistor and overlapping the first portion of the power line; and forming a pixel electrode formed in the pixel region and connected to the first driving thin film transistor.

* * * * *